United States Patent [19]

Chou et al.

[11] Patent Number: 5,284,823
[45] Date of Patent: Feb. 8, 1994

[54] SUPERPLASTIC FORMING OF $YBA_2CU_3O_{7-x}$ CERAMIC SUPERCONDUCTORS WITH OR WITHOUT SILVER ADDITION

[75] Inventors: Ye T. Chou, Bethlehem; Martin P. Harmer, Allentown; Jondo Yun, Whitehall, all of Pa.

[73] Assignee: Lehigh University, Bethlehem, Pa.

[21] Appl. No.: 753,914

[22] Filed: Sep. 3, 1991

[51] Int. Cl.$^5$ ............................................. H01L 39/12
[52] U.S. Cl. ......................................... 505/1; 264/56; 264/65; 264/66; 264/320; 505/739; 505/780
[58] Field of Search .................... 264/56, 65, 66, 320, 264/322, 323; 505/1, 739, 740, 780, 781

[56] References Cited

U.S. PATENT DOCUMENTS

| | | | |
|---|---|---|---|
| 4,411,959 | 10/1983 | Braginski et al. | 428/558 |
| 4,419,125 | 12/1983 | Charles et al. | 75/0.5 B |
| 4,575,927 | 3/1986 | Braginski et al. | 29/599 |
| 4,892,861 | 1/1990 | Ray | 505/1 |
| 4,975,414 | 12/1990 | Meeks et al. | 505/1 |
| 4,980,340 | 12/1990 | Anderson et al. | 505/1 |
| 5,100,867 | 3/1992 | Gunzelmann et al. | 505/739 |

FOREIGN PATENT DOCUMENTS

| | | |
|---|---|---|
| 0301655 | 1/1989 | European Pat. Off. . |
| 63-2276810 | 11/1988 | Japan . |
| 193301 | 4/1989 | Japan . |

OTHER PUBLICATIONS

Samanta et al. "A Novel Processing Technique for Fabrication of Flexible $YBa_2Cu_3O_{7-x}$ Wire", J. App. Phys. 66(9) p. 4532 Nov. 1, 1989.

"Critical Current and Electronic Properties of YBCO-Ag Compounds", B. Dwir, M. Affronte and D. Pavuna, Physica C 162-164 (1989) 351-352, North-Holland.

"Effect of Silver and Silver Oxide Additions on the Mechanical and Superconducting Properties of $YBa_2Cu_3O_{7-x}$ Superconductors", J. Appl. Phys. 66(7), Oct. 1989, pp. 3154-3157.

"Phase-Equilbrium Diagram in the Ternary System $Y_2O_3$-BaO-CuO", Kunihiko Oka, et al., Japanese Journal of Applied Physics, vol. 27, No. 6, Jun. 1988, pp. L 1065-L 1066.

"Hot Isostatic Pressing of Superalloys, Superconductors and Composites", John K. Tien et al., MPR 1989, pp. 459-463.

"Hot-Processing of Yttrium Barium Copper Oxide ($YBa_2Cu_3O_y$) Ceramic Powder", Toshihiko Nishida et al., Ser. Sci. Technol. 1988, pp. 37, 96-104.

"Imrpoved Formability of Aluminum-Germanium Near Eutectic Compositions Through the Application of Superplasticity Principles", G. J. Pech, 1977, p. 54.

"Superplasticity of an Yttrium Barium Copper Oxide ($YBa_2Cu_3O_{7-x}$) Ceramic Compound", O. A. Kaibyshev, et al., 1989, abstract only.

"Superplasticity and Superconductivity", M. C. Mittal et al., Int. Conf. on Mech. Behav. of Mater, 2nd Proc., Boston, Mass. Aug. 16-20, pp. 308-312, abstract only.

*Primary Examiner*—Jan H. Silbaugh
*Assistant Examiner*—Christopher A. Fiorilla
*Attorney, Agent, or Firm*—Oblon, Spivak, McClelland, Maier & Neustadt

[57] ABSTRACT

A process for superplastically forming and shaping a solid object including 123 superconductor, including preparing a solid object having grains of 123 superconductor that have an average grain size of less than 10 microns, and superplastically deforming the prepared solid object by heating the solid object to between 500° and 1015° C. while simultaneously applying to said solid object stress which is less than the fracture strength of the solid object, thereby producing a strain rate in the solid object. The solid object may be a composite including silver or gold.

20 Claims, 5 Drawing Sheets

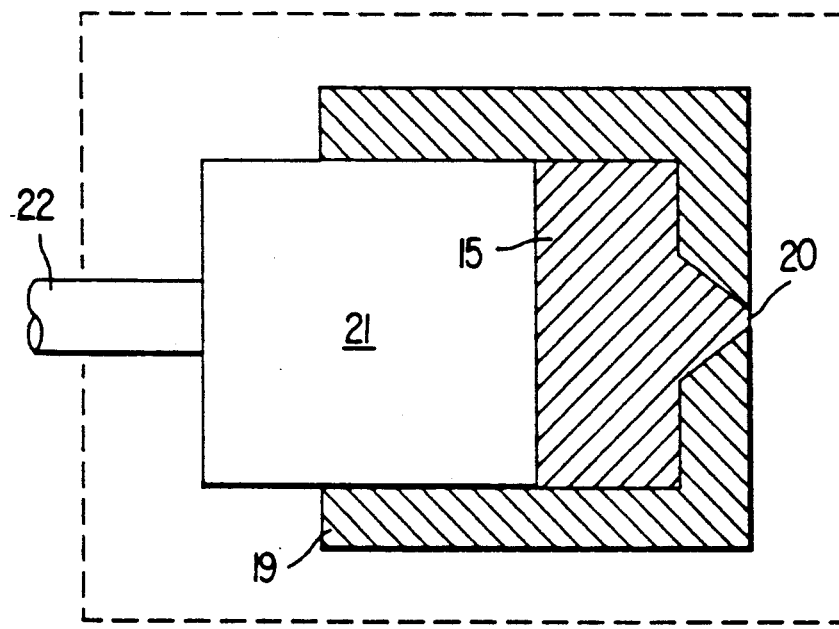
*FIG. 5*
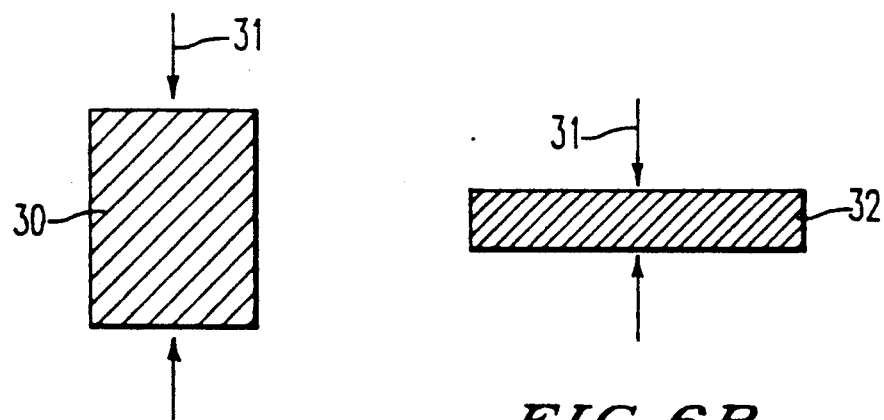
*FIG. 6A*  *FIG. 6B*

SUPERPLASTIC FORMING OF $YBa_2Cu_3O_{7-x}$ CERAMIC SUPERCONDUCTORS WITH OR WITHOUT SILVER ADDITION

BACKGROUND OF THE INVENTION

1. Field of the Invention

This invention relates generally to the fabrication of ceramic objects. In particular, this invention relates generally to forming of ceramic materials. More particularly, this invention relates to forming of high temperature ceramic superconductors and composites thereof.

2. Discussion of the Background

Recently superconductivity in polycrystalline $Y_1Ba_2Cu_3O_7$ above 90° K was discovered. This compound has a structure which is a modification of the cubic perovskite structure. The perovskite structure has cubic symmetry, with one metal ion at the center of each cubic unit cell and three oxygen atoms for each unit cell. The crystal structure of $Y_1Ba_2Cu_3O_7$, hereinafter called the 123 structure represents a tripling of the perovskite unit cell with Y or Ba atoms at the center of each cube of the perovskite sub cells. Many materials have the 123 structure, and these materials will be referred to hereinafter as 123 material. The 123 structure is also deficient in oxygen, as compared with the perovskite structure, which would have nine oxygens instead of the seven present in fully oxygenated 123 material. The oxygen content of 123 material can be lowered to 6 while maintaining the cation structure. Lowering the oxygen content changes 123 materials from conducting, to insulating. In addition, the fully oxygenated 123 material (with oxygen content between 6.9 and 7.0) has an orthorhombic distortion of the tripled perovskite lattice unit cells, while the insulating 123 material (with oxygen content below 6.5) has a tetragonal distortion of the tripled perovskite lattice unit cells. Y can be replaced by any trivalent rare earth or lanthanum without significantly affecting the 123 structure, or the superconducting properties. In addition, the rare earths and La are so similar to Y that the cohesive properties, and phase diagrams which are determined by the cohesive properties, of materials containing Y, La or a rare earth, are all very similar.

Therefore, use of yttrium in the rest of this patent is exemplary only, since La and rare earth elements provide very similar properties, and the variation of these properties between yttrium compounds, and the homologous compounds are well known. In particular, 123 materials in which Y is replaced by similar elements, such as La, Pr, Nd, Sm, Gd, Dy, Ho, Er, or Tm, are all superconducting at over 90° K.

123 superconductor applications are generally split into thin film and bulk applications. Thin film devices are relatively easy to make because no mechanical strain is involved in their fabrication. In contrast, bulk components of 123 material must either be cast, or formed. 123 material suffers from brittleness, poor ductility, oxygen instability upon heating, and phase instability above the melting point. In this regard, $Y_1Ba_2Cu_3O_7$, $BaCuO_2$ and CuO form an eutectic at 900° centigrade (C), so that above 900° C. liquid and solid phases coexist, unless the heated material is essentially perfectly stoichiometric $Y_1Ba_2Cu_3O_7$. These properties provide several drawbacks to both casting and forming.

Several techniques for dealing with these problems have been attempted, and their results have been reported in the scientific literature. However, each of these methods has disadvantages. Ceramic superconductor shapes have been prepared by compacting the powders into a mold followed by a heat treatment. This type of process is reported, for example, in European Patent Application number 88201568.8 published 01.02.89, "Method of preparing an oxidic superconductor material". This publication also discloses a method for preparing submicron size particles of 123 superconductor.

Complex shapes cannot be obtained by compacting powders, because volume shrinkage occurs during the subsequent sintering steps, and results in incorrect shapes. Subsequent machining of ceramic bodies is very difficult, because the ceramics are hard and brittle, and often leads to cracks in the ceramic, and can quickly wear out machine tool bits. Because of the difficulty of machining these materials, complex shapes cannot be obtained by this method.

Powdered compacts of ceramic superconductors contained in metallic sheaths have been formed into shapes by rolling or drawing of the sheath material, as reported in "HOT-PRESSING OF YTTRIUM, BARIUM, COPPER OXIDE ($Y_1Ba_2Cu_3O_y$) CERAMIC POWDER" by Nishida, et al, published in Mem. Fac. Eng. Des., Kyoto Institute of Technol. 1988, 37, 96-104 (Eng). This article discloses hot extrusion of a metallic can containing superconducting $YBa_2Cu_3O_y$ ceramic powder. The can is first heated to 700° to 1,000° C. and then immediately deformed by hot processing, and also rapidly cooled to room temperature. The resulting material changed to the tetragonal insulating structure from the orthorhombic superconducting structure during the processing.

Rolling or drawing techniques have the disadvantage that they require a sheath. Because of the sheath, heat treatment of the formed shapes leads to shrinkage of the powder compact and results in separation of the powder from the sheath. Also, the sheath prevents oxygen from penetrating into the superconducting material during oxygen annealing. Large cracks are likely to form because of these problems, since the 123 material changes density upon sintering and oxygenation, and these cracks cannot be removed by heat treatment. In addition, this method is only suitable for preparation of wire or bar.

FIG. 8A displays a bulk object having the 123 structure before and FIG. 8B after being compressed by a process of the prior art. A bulk structure of 123 superconductor 50, is deformed to a limited amount by stress applied in the direction indicated by the arrows 51. Further deformation leads to crack formation in the deformed object 52 in FIG. 8B, crack growth and finally the deformed structure 52 is fractured, as shown by fracture lines 53.

The article by Kaibyshev et al "SUPER-PLASTICITY OF AN YTTRIUM, BARIUM, COPPER OXIDE ($YBa_2Cu_3O_{7-x}$) CERAMIC COMPOUND" (Inst. Probl. Sverkhtverd. Met., Ufa, USSR); Dokl. Akad. Nauk SSSR 1989, 305 (5), 1120-30 [Tech. Phys.] (Russ), discloses superplasticity of 123 ceramic compounds between 900° and 950° C. after "dynamic recrystallization". As noted earlier, 900° C. is the liquid phase formation temperature of $YBa_2Cu_3O_7$ in the presence of impurity phases of $BaCuO_2$ and CuO. Plastic deformation at high temperatures close to the melting point of $Y_1Ba_2Cu_3O_7$ and above the liquid phase formation temperature is easily obtained, because the diffusion rate is very high, and the liquid phase that exists between the grains allows easy movement of the grains relative to one another.

Superplasticity is defined in "Metals Handbook" published by the American Society for Metals, Metals Park Ohio, 1985, as the ability of certain metals to undergo unusually large plastic deformation without local necking or failure. This definition also applies to ceramics. "Unusually long" depends upon the material. For ceramics, less than 10% elongation is typically considered normal plastic deformation, as opposed to superplastic deformation.

The deformation behavior of $YBa_2Cu_3O_7$ at temperatures above 900° C. where liquid phase exists, and below 900° C. where no liquid phases exists are very different, because below 900° C. the mechanism relieving stress due to a liquid phase is absent. Therefore, below 900° C. stress can only be relieved by solid state mechanisms, which are inconsequential above 900° C. The temperature scale is also important because it is technologically easier to work at lower temperatures, such as below 900° C., than at temperatures above 900° C.

The Japanese patent to Matsumoto (JP 1-93301 (A)) describes a plastic processing method for superconductive ceramics. The critical conditions specified in this patent are a temperature range of 500° to 850° C. and strain rates of less than $2.2 \times 10^{-1}$ per second at 850° C., and $3.3 \times 10^{-5}$ per second at 500° C. JP 1-93301 does not mention the grain size of the material used.

The material used in this reference was sintered at between 950° and 1,300° C. This temperature range extends above the liquid phase formation temperature of 900° C. Sintering above the liquid phase formation temperature dramatically enhances the grain growth rate. As a result of such high temperature sintering, small grain sizes, such as those disclosed hereinafter in the present invention, cannot be obtained.

JP 1-93301 also discloses a flow stress versus temperature plot (FIG. 2) which does not follow the established exponential function for the high temperature deformation of ceramics. It is probable that the results from JP 1-93301 are due to a multi-phase material, since the reported temperature range for sintering exceeds the 123 phase stability temperature of 1,015° C. for $Y_1B_2Cu_3O_7$, which results in production of a multi-phase material.

While the aforementioned teachings are useful for providing formed shapes, they do not provide a method for providing complicated shapes of 123 superconductors and composites thereof without cracks and to precise tolerances.

SUMMARY OF THE INVENTION

Accordingly, one object of this invention is to provide a novel method for forming and shaping bulk ceramic superconductor structures.

Another object of this invention is to provide a novel method for forming and shaping crack-free bulk ceramic superconductor structures.

Another object of this invention is to provide a novel method for preparing complicated bulk ceramic superconductor structures to precise tolerances.

Another object of this invention is to provide a novel method to form and shape bulk ceramic superconductor structure to have smooth surfaces.

Another object of this invention is to provide a novel method to rapidly form and shape ceramic superconductor structures.

Briefly, these and other objects of the invention can be obtained by providing a new and improved process for forming a solid object including 123 superconductor in which the average 123 superconductor grain dimensions are less than 10 microns, and superplastically deforming the solid object into a desired shape by heating the solid object to between 500° and 1015° C. while simultaneously applying stress to the solid object which is less than the fracture strength of the solid object. The stress induces a strain rate in the solid object thereby deforming the solid object into the desired shape. The flow stress is a function of the strain rate, grain size, and temperature.

The strain can be maintained by providing a compressive load to the 123 material thereby to perform superplastic deformation of the superconductor composite.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a side view of a device for extruding materials at high temperatures;

FIG. 6A shows a bulk ceramic before forming;

FIG. 6B shows a bulk ceramic after forming;

DESCRIPTION OF THE PREFERRED EMBODIMENTS

Figure 1:
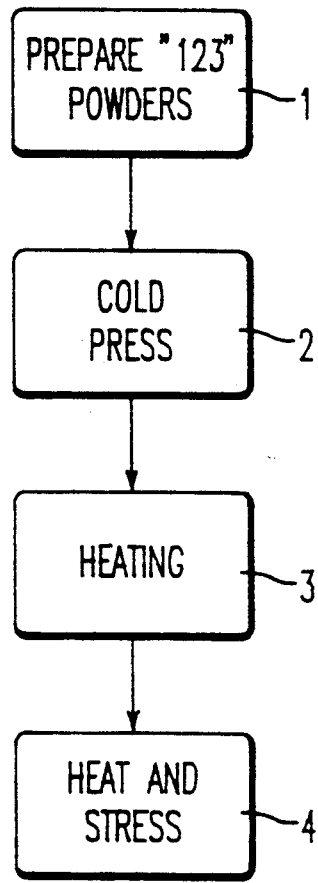
FIG. 1 is a flow chart showing process steps for preparation of a formed structure containing superconducting 123 material.

Referring now to the drawings, wherein like reference numerals designate identical or corresponding parts throughout the several views, and more particularly to FIG. 1 thereof, which shows process steps for the preparation of a formed structure of the present invention. The 123 starting material can be either the oxygenated material with orthorhombic structure, or oxygen deficient material with a tetragonal structure. Ceramic powder of 123 material with submicron particle size is prepared in step 1. Preparation of submicron particle size powder of 123 material is well known in the art. This powder is then cold pressed in step 2 into a bulk preform. Cold pressing can be accomplished using a uniaxial cold press machine and/or cold isostatic press machine. If a uniform density of the 123 powder compact can not be provided by uniaxial pressing due to the geometry of the preform, isostatic pressing is necessary to provide uniformity. The preformed powder compact may optionally be preheated in order to remove reacted layers from the surface of the 123 material. The preheating occurs at 800° to 850° C. for 0 to 100 hours. The preform powder compact is then sintered at between 800° and 900° C. for 0 to 100 hours.

One of the critical conditions for superplastic deformation is a small grain size in the sintered material. The sintered material should have an average grain size of less than 10 microns, and preferably less than 1 micron. The powder compacts of submicron particle size are sintered at temperatures below the liquid phase formation temperature of 900° C., since the presence of liquid phase provides for fast grain growth by liquid phase sintering. The preferred sintering temperature for preparation of fine grain material in air is between 800° and 900° C., and most preferably between 850° and 900° C.

The powder compact can be sintered in air or an oxygen atmosphere. A pure oxygen atmosphere raises the liquid phase formation temperature approximately 20° to 30°. Therefore the sintering temperature in a pure oxygen atmosphere can be raised by 20° to 30°.

The presintered 123 material may contain several percent of second phase impurities. The impurities include, $CuO$, $BaCuO_2$, $Y_2BaCuO_5$, $BaCO_3$, $BaO$, $Y_2O_3$, $Y_2CuO_4$, or glass phases. Some of these second phases may be intentionally introduced into the microstructure of the initial 123 material for the purpose of inhibiting grain growth. The phases are introduced by changing the ratio of starting powders of yttrium, barium, and copper compounds used for the preparation of 123 material. It is preferred that less than 10 percent of impurity phases be included. The heating steps are shown in step 3 for the preparation of a ceramic material with, for example, a grain size of less than 10 microns or preferentially less than one micron.

In step 4 the ceramic is heated to a selected temperature and placed under an appropriate stress which is less than the fracture strength, in order to maintain a strain rate without cracking. Cracking occurs when the flow stress exceeds the fracture strength of the material. The strain rate, $d\epsilon/dt$, is defined as the fractional change in length of the ceramic with time, by the formula:

$$\frac{d\epsilon}{dt} = \frac{1}{L} \frac{dL}{dt} = \frac{V}{L} \quad (1)$$

where L is the sample length, t is time and V is the cross head speed. The grain size, temperature, and strain rate are related by the equation:

$$\frac{d\epsilon}{dt} = C \frac{\sigma^n}{d^p} \exp(-Q/kT) \quad (2)$$

wherein C, n and p are constants, $\sigma$ is the flow stress, d is the grain size of the material, Q is the activation energy, k is Boltzmann's constant, and T is the temperature. Grain size, temperature, and strain rate are carefully selected so that the flow stress, $\sigma$, does not exceed the fracture strength of the material. In particular, note that strain rate increases rapidly with decreasing grain size, when all other factors are unchanged.

The forming step of the invention is performed at sufficiently high temperatures so that the diffusivity, reflected in the exponential portion of Equation 2, is large enough so that commercially useful strain rates for superplastic deformation are achieved. For instance, the strain rate limit at which the stress crack threshold is reached at 500° C. is roughly $10^{-6}$ per second. In addition, when the temperature is above 1,015° C., the 123 compound superconductor decomposes into other phases. Thus, a suitable temperature range for super-plastic deformation is between 500° and 1,015° C.

In addition, the lowest eutectic of 123 compound superconductor in the presence of a second phase is at 900° C. Above 900° C. liquid phase exists in equilibrium with the solid phase. Since liquid phase promotes very rapid grain growth, and grain growth is detrimental to the superplastic deformation, a more preferred upper temperature limit during plastic forming is 900° C. Furthermore, strain rates above $10^{-5}$ per second are more commercially useful. This strain rate implies, through equation II, a preferred lower temperature limit of 700° C. Thus, the optimum temperature range for superplastic deformation of the invention is 700° to 900° C.

Figure 2:
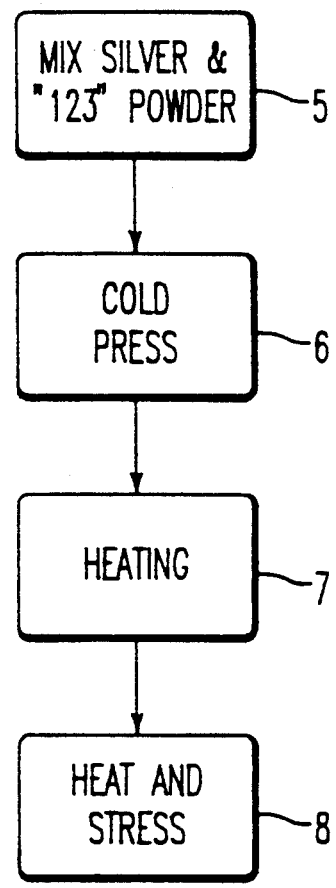
FIG. 2 is a flow chart showing process steps for the preparation of a formed structure containing superconducting 123 material and silver.

In an alternative embodiment of the invention, the starting material consists of yttrium, barium, copper oxide superconductor powder with submicron grain size, along with a powder containing silver or gold. The process steps for this embodiment are shown in FIG. 2. A powder mixture is prepared in step 5 by mixing powder of submicron grain size 123 material with 0 to 80% silver in a powdered silver compound, such as metallic silver, a silver oxide or silver nitrate, or 0-80% gold powder. The powders are cold pressed in step 6 into a composite preform. The composite preform is preheated and sintered in step 7 in accordance with the description of the process for pure 123 compound superconductor discussed above in step 3. In step 8, the compound preform is heated and placed under stress which is below the fracture strength in order to provide a selected strain rate.

Addition of silver to the 123 material increases the toughness, strength and ductility of the sintered material. In addition, silver phase at the grain boundaries of the 123 compound can absorb crack propagation energy, thereby preventing the composite material from catastrophically failing.

Figure 3:
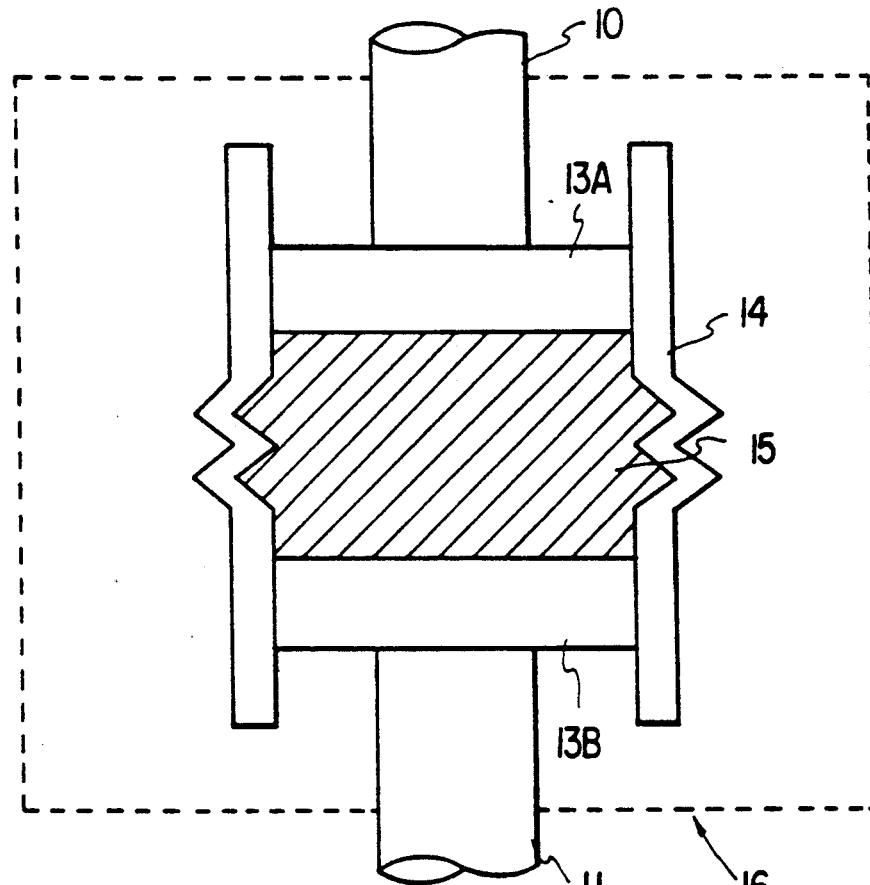
FIG. 3 is a side view of a hot press for providing uniaxial compressive stress.

FIG. 3 shows an apparatus for providing uniaxial pressure for accomplishing the method of the present invention. This figure shows piston rods 10 and 11 connected to press heads 13A and 13B inside the mold 14. Between the heads of the press and inside the mold is the 123 material 15. The press is enclosed in a furnace whose outer walls are indicated by 16.

Figure 4:
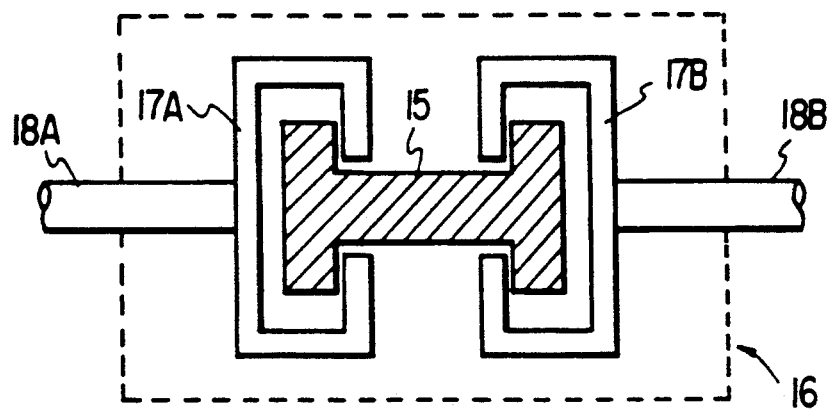
FIG. 4 is a side view of a device for providing tensile stress at high temperatures.

FIG. 4 shows a device for applying tensile stress in order to accomplish the process of the present invention. This structure shows the outer wall of a furnace indicated by 16. 123 material indicated by 15 is held by clamp heads 17A and 17B which are pulled by pull rods 18A and 18B.

FIG. 5 shows a device for extruding according to the present invention. FIG. 5 shows 123 material at 15, enclosed in an extrusion press consisting of socket 19 with opening 20 through which material is extruded. The material 15 is pressed into the socket by plug 21. Pressure is applied to plug 21 through rod 22.

FIG. 6A shows a solid object, 30, before forming according to the present invention. Arrows 31 indicate the directions of compressive stress applied by the process of the present invention. FIG. 6B shows a formed solid object derived through application of the process of the invention to object 31, by object 32.

Figure 7:
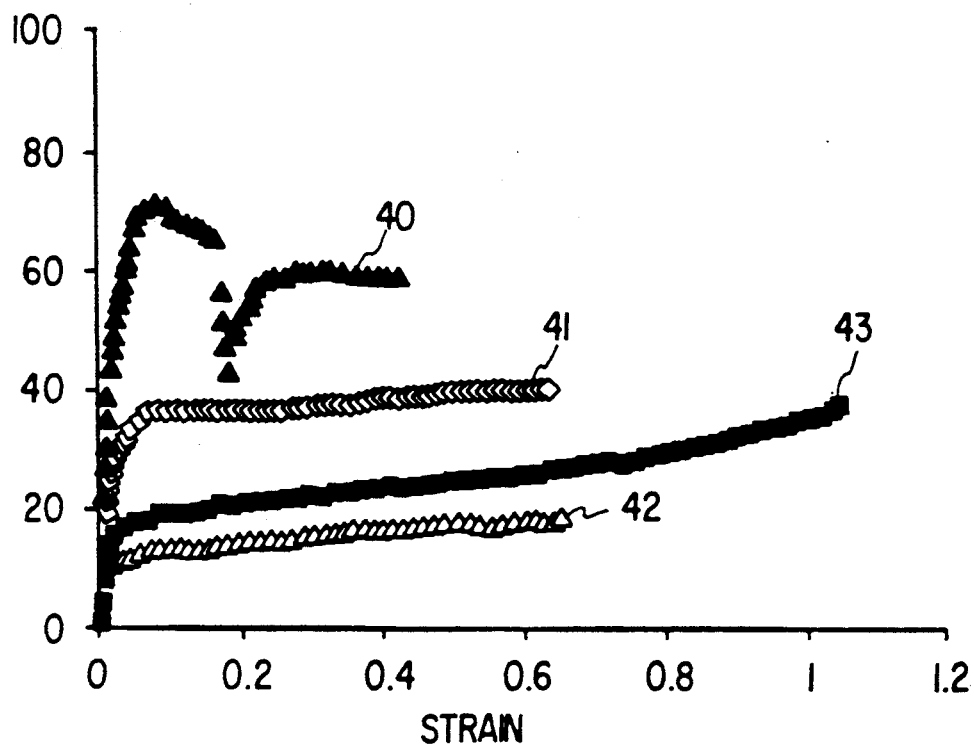
FIG. 7 shows high temperature deformation curves, for composites of yttrium, barium, copper oxide with 25% silver, at selected temperatures.
Figure 8A:
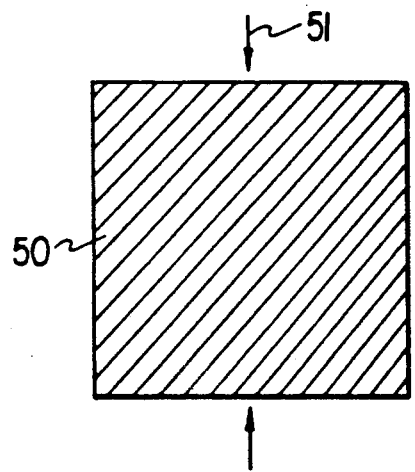
FIG. 8A shows a bulk structure before forming.
Figure 8B:
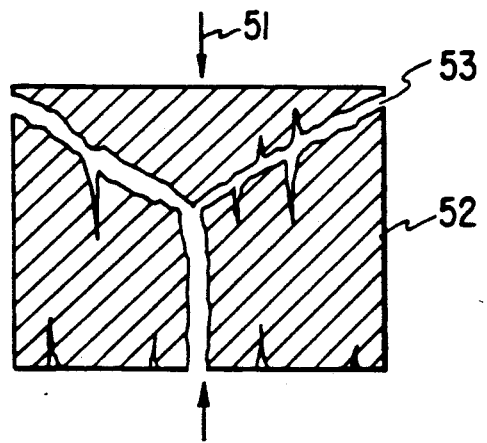
FIG. 8B shows a bulk structure after forming according to a method of the prior art.
Figure 9A:
FIGS. 9A-9J show some solid object shapes that can be formed by the process of this invention.
Figure 9B:
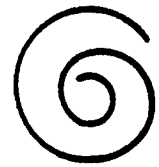
Figure 9C:
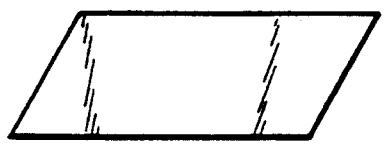
Figure 9D:
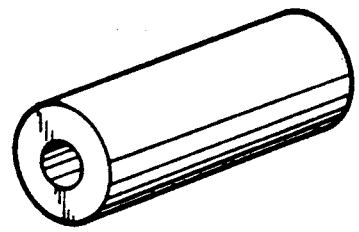
Figure 9E:
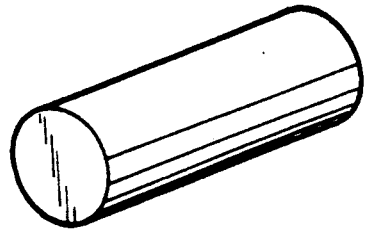
Figure 9F:
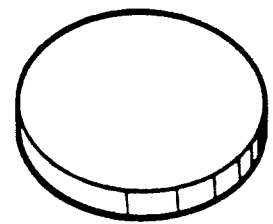
Figure 9G:
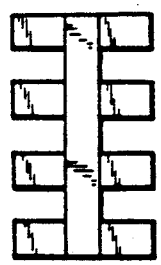
Figure 9H:
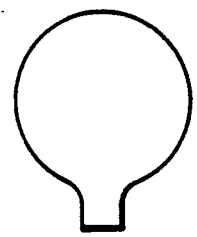
Figure 9I:
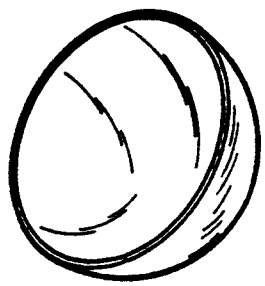
Figure 9J:
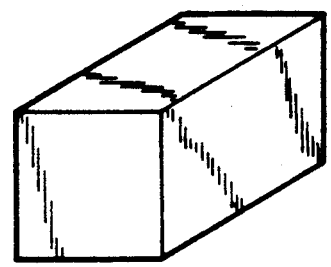

FIG. 7 displays high temperature deformation curves for composites of $Y_1Ba_2Cu_3O_7$-silver composites with 25% by volume silver metal. This figure shows data that defines curves for stress in megapascals versus total strain, at selected temperatures and strain rates. Curve 40 shows results for 775° C. and a strain rate of $2.1 \times 10^{-5}$ per second. Curve 41 shows results for 800° C. and a strain rate of $5.1 \times 10^{-5}$ per second. Curve 42 shows results for 825° C. and a strain rate of $5.3 \times 10^{-5}$ per second. Curve 43 shows results for 850° C. and a strain rate of $4.8 \times 10^{-4}$ per second. No cracks were observed in the deformed samples for which the data in FIG. 7 appears.

FIGS. 9A through 9J show several of the possible formed and shaped bulk objects containing high temperature superconductors which can be produced by the process of the present invention, including wire 9A, coil 9B, sheet 9C, tube, 9D, rod 9E, disk 9F, antennae 9G, bulb 9H, reflector 9I, and box 9J.

EXAMPLE 1

Submicron particle size 123 compound powder was pressed into pellets under a pressure of 10,000 psi with a cold press machine. The pellets were pressed again under hydraulic pressure at 50,000 psi with a cold isostatic press machine. The pellets were preheated at 800° C. for 4 hours and sintered at 875° C. for 6 hours, in air. The sample microstructure was 95% of the theoretical density, and had a submicron grain size. The presintered sample was tested in compression with an Instron Materials Testing System at 850° C. at a nearly constant strain rate of $1.7 \times 10^{-4}$ per second. The presintered sample was deformed with a reduction in length of over 100% under a nearly constant stress of $1.6 \times 10^3$ pounds per square inch.

EXAMPLE 2

Submicron particle size 123 superconductor compound powder was mixed with 25 volume percent metallic silver powder. The mixture was pressed into pellets under a pressure of 10,000 psi with a cold press machine. The pellets were pressed again under a hydraulic pressure at 50,000 psi in a cold isostatic press machine. The pellets were preheated at 800° C. for 4 hours and sintered at 875° C. for 6 hours in air. The presintered sample had 95% theoretical density and a submicron grain size. The samples were tested in compression with a Instron Materials Testing System at 764° C. and a nearly constant strain rate of $1 \times 10^{-5}$ per second. The sample was deformed with a 31.5% reduction in length without surface cracking under the nearly constant flow stress of $8 \times 10^3$ psi.

EXAMPLE 3

A 123 superconductor sample with 25 volume percent silver was prepared as in the procedure listed in Example 2. The sample was tested in compression with an Instron Materials Testing System at 850° C. and a nearly constant strain rate of $1.2 \times 10^{-5}$ per second. The sample was deformed with a 120% reduction in length without surface cracking.

The plastic forming process of the invention allows effectively unlimited change in the physical dimensions of the 123 superconductor and composites thereof, because the stress does not increase with increasing total change in length. Therefore the process is useful for preparation of such objects as extruded wire, thin sheets, and complicated structures such as coils and cavities, and antennae among others. The relatively high strain rates that are achieved by this process allow rapid fabrication of formed parts with smooth surfaces and exact tolerances, that do not have cracks. The moderate temperatures of the forming process of the invention are easily achieved with conventional equipment.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A process for forming and shaping a solid object including 123 superconductor, comprising the steps of:
    preparing a solid object having grains of 123 superconductor that have an average grain size of less than 10 microns, wherein the step of preparing the solid object comprises the steps of preparing a powder mixture including submicron particles including 123 material,
    compacting said powder mixture into a powder compact by applying pressure to said powder,
    sintering the powder compact at between 800° and 900° C., thereby producing said solid object; and
    superplastically deforming said solid object into a desired shape, by heating said solid object to between 500° and 1015° C. and simultaneously pressing said solid object into said desired shape by applying to said solid object stress which is less than the fracture strength of said solid object, thereby producing a strain rate in said solid object.

2. A process according to claim 1, wherein said step of preparing a solid object comprises:
    including at least one second phase selected from members of the group consisting of CuO, $Y_2BaCuO_5$, BaO, $BaCuO_2$, $BaCO_3$, $Y_2O_3$, and $Y_2CuO_4$, in said solid object.

3. A process according to claim 1, wherein said step of superplastically deforming said solid object is carried out by a process selected from the group consisting of compressively deforming, tensilely deforming, and hydrostatically extruding.

4. A process according to claim 1, wherein said step of superplastically deforming comprises heating of said solid object to between 700° and 900° C.

5. A process according to claim 4, wherein said step of superplastically deforming comprises:
    applying a stress to said solid object, thereby producing a strain rate between $10^{-5}$ and $10^{-3}$ per second.

6. A process according to claim 1, wherein the step of superplastically deforming comprises:
    changing a length of said solid object by at least 30%.

7. A process according to claim 1 wherein said step of superplastically deforming said solid object comprises:
    changing a length of said solid object by at least 120%.

8. A process, according to claim 1, wherein said step of preparing a solid object comprises:
    preparing said solid object having a grain size of less than one micron.

9. A process according to claim 1, wherein said step of preparing a solid object comprises:
    preparing a solid object of 123 superconductor including at least one compound selected from the group of compounds which have the $Y_1Ba_2Cu_3O_7$ crystal structure, with a member of the group consisting of Y, La, and those rare earth elements which provide superconductivity below 90 degrees Kelvin when in the $Y_1Ba_2Cu_3O_7$ crystal structure occupying the Y lattice site.

10. A process, according to claim 9, wherein said step of preparing a solid object comprises:
preparing solid objects of 123 superconductor including $Y_1Ba_2Cu_3O_7$.

11. A process, according to claim 9, wherein said step of preparing a solid object comprises:
preparing solid objects of 123 superconductor including $Y_1Ba_2Cu_3O_{6+x}$ wherein $0.7 < X < 1$.

12. A process according to claim 1, wherein said step of compacting comprises:
applying to said powder mixture pressure using at least one of uniaxial and hydrostatic pressure between 1,000 and 100,000 pounds per square inch.

13. A process according to claim 1, wherein the step of sintering comprises:
preheating said powder compact at a temperature between 800° and 850° C. for 0–100 hours, thereby removing reacted surface layers on the surface of the 123 compound.

14. A process according to claim 1, wherein said step of preparing a powder mixture comprises:
including 0 to 80 percent by weight silver, wherein the silver is in a member selected from the group consisting of metallic silver, silver oxides, and silver nitrate.

15. A process according to claim 1, wherein said step of sintering the powder compact, comprises:
sintering at a temperature between 850° and 900° C. in air.

16. A process according to claim 1, wherein said step of sintering the powder compact comprises:
sintering at between 870° and 930° C. in an oxygen atmosphere.

17. A process according to claim 1, wherein said step of preparing a powder mixture comprises:
including tetragonal phase 123 material that has a lower oxygen content than 123 superconductor.

18. A process according to claim 1, wherein said step of preparing a powder mixture comprises:
including 0 to 80 percent by weight gold.

19. A process according to claim 1, wherein said step of superplastically deforming comprises:
pressing said solid object into a mold defining said desired shape.

20. A process according to claim 1, wherein said step of superplastically deforming comprises:
applying a stress to said solid object, thereby producing a strain rate between $10^{-6}$ and $10^{-2}$ per second.

* * * * *